United States Patent [19]

Tresselt

[11] Patent Number: 5,081,424
[45] Date of Patent: Jan. 14, 1992

[54] UNEQUAL STUB LENGTH DIPLEXING MICROWAVE FREQUENCY DISCRIMINATOR CIRCUIT

[75] Inventor: Carl P. Tresselt, Towson, Md.

[73] Assignee: The United States of America as represented by the Secretary of the Navy, Washington, D.C.

[21] Appl. No.: 644,363

[22] Filed: Jan. 18, 1991

[51] Int. Cl.⁵ .............................................. H03D 3/26
[52] U.S. Cl. ................................. 329/322; 307/519; 328/141; 331/9
[58] Field of Search ........................... 331/9; 329/322; 307/510, 519; 328/140, 141; 455/214, 337

[56] References Cited

U.S. PATENT DOCUMENTS

| | | | |
|---|---|---|---|
| 3,676,785 | 7/1972 | Pichal | 329/103 |
| 4,085,377 | 4/1978 | Turski et al. | 329/116 |
| 4,281,293 | 7/1981 | Childs et al. | 329/105 |
| 4,384,367 | 5/1983 | King et al. | 455/325 |
| 4,636,753 | 1/1987 | Geller et al. | 333/26 |
| 4,694,260 | 9/1987 | Argintaru et al. | 331/9 |

*Primary Examiner*—Siegfried H. Grimm
*Attorney, Agent, or Firm*—Harvey A. Gilbert; Melvin J. Sliwka; John L. Forrest, Jr.

[57] ABSTRACT

A microwave frequency discriminator circuit useful as a frequency linearization device includes a microstrip input conductor and a pair of microstrip output conductors, a pair of resistors, a pair of microstrip transmission line diplexer stubs of unequal lengths, a pair of detector diodes, and a quad of microstrip filter stubs. Each resistor at one end is connected to the same end of the input conductor and in parallel relation to one another. Each diplexer stub at one end is connected to an opposite end of one resistor and in parallel relation to one another. Each diplexer stub is open-circuited at an opposite end. Each detector diode at one end is connected to the one end of one stub and at an opposite end to one output conductor. The filter stubs are interposed in spaced pairs in one output conductor.

11 Claims, 1 Drawing Sheet

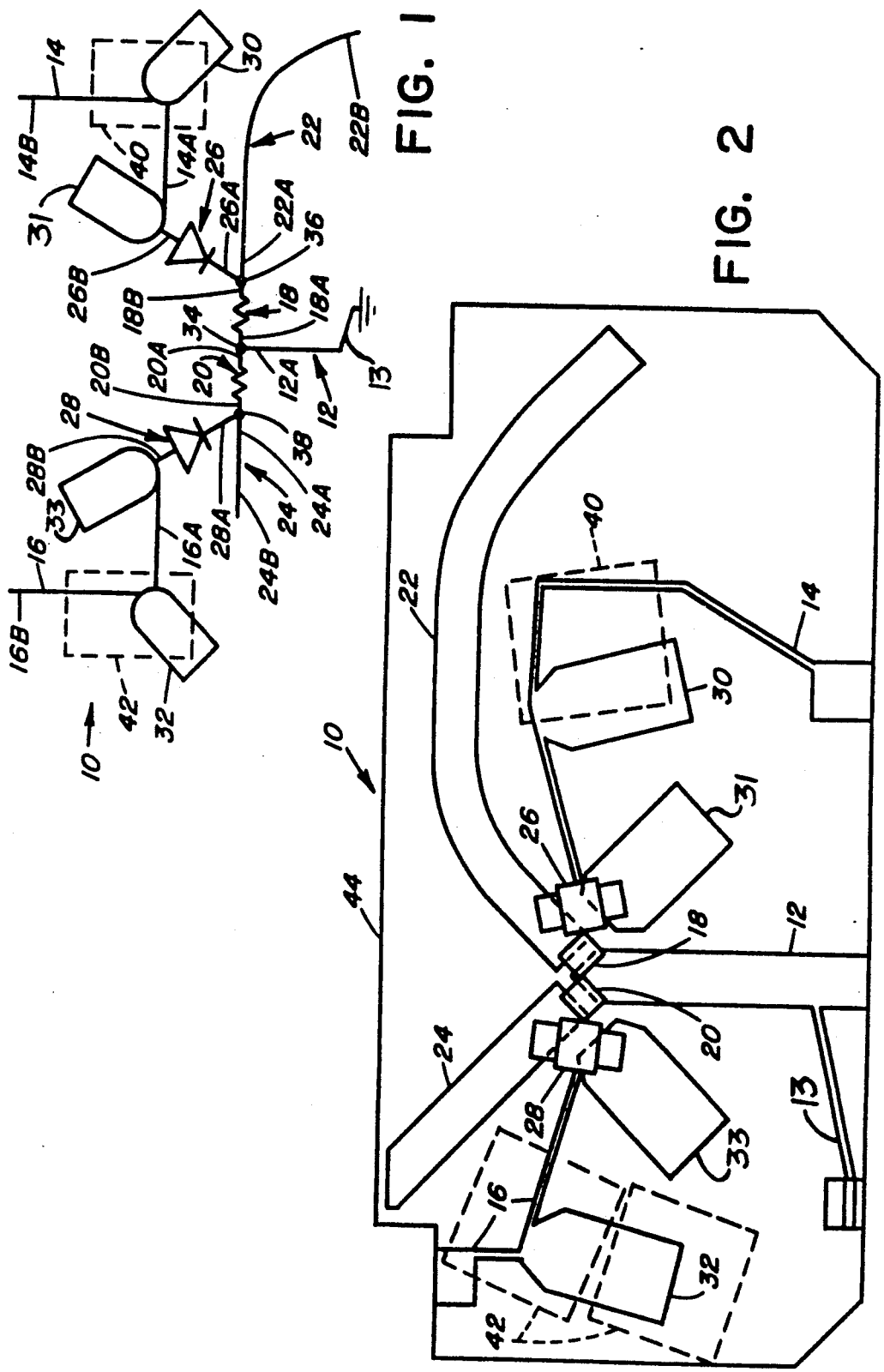

UNEQUAL STUB LENGTH DIPLEXING MICROWAVE FREQUENCY DISCRIMINATOR CIRCUIT

BACKGROUND OF THE INVENTION

The present invention generally relates to microwave discriminator circuits and, more particularly, to an unequal stub length diplexing microwave frequency discriminator circuit.

Discriminator circuits have various usages, the most common of which is for demodulation of frequency-modulated signals. A variety of discriminator circuit types have been disclosed over the years.

One discriminator circuit type which uses two different frequency-sensitive portions tuned to different center frequencies, with a detector diode attached to each portion, is similar to a conventional Round-Travis discriminator circuit. Another discriminator circuit type is similar to a conventional Foster-Seeley discriminator circuit. The Foster-Seeley discriminator circuit type splits power and uses differential line lengths and power recombination to produce two different frequency selectivities by phasing. Low frequency versions of these two named circuit types have been used in FM radio receivers for years. See for example, the "Radiotron Designer's Handbook", 4th Edition, edited by F. Langford-Smith, 1953, reproduced and distributed by RCA, Harrison, NJ.

A review and analysis of the microwave version of the Foster-Seeley discriminator circuit type, based on broadband 90°, -3 dB hybrids and differential line lengths, may be found in "MIC 7-to-11 GHz Frequency Discriminator", by U.H. Gysel and J.P. Watjen, Stanford Research Institute, Final Report, AD/A034977, September 1976. In contrast to this broadband design, current interest centers on microwave discriminator circuits which operate in this same general area, but have superior linearity over a much more restricted bandwidth on the order of five percent maximum.

SUMMARY OF THE INVENTION

The present invention relates to an unequal stub length diplexing microwave frequency discriminator circuit designed to satisfy the current interest. The primary application envisioned for the discriminator circuit of the present invention is use as a frequency linearization means for a voltage-controlled oscillator (VCO) via a closed loop servo system around the VCO and discriminator. Also, with suitable low-noise microwave preamplification, the discriminator circuit of the present invention would serve as a demodulator. Further, certain FM-CW radar systems require extremely linear FM sweep to achieve good range sensitivity. The discriminator circuit of the present invention has proved capable of providing that linearity. It does so while using conventional packaged detector diodes, whose package capacities ordinarily prevent them from being used in more conventional microwave circuit configurations. The unequal lengths of the diplexer stubs approximately equalize the linearity of the slopes of the two detector diodes.

Accordingly, the present invention is directed to a microwave frequency discriminator circuit which comprises: (a) an input; (b) a pair of resistors connected in common to the input; (c) a pair of transmission line diplexer stubs of unequal lengths, each diplexer stub connected to a respective one of the resistors and having an open-circuited end; (d) a pair of detector diodes each connected in common along with one of the diplexer stubs to a respective one of the resistors; (e) a pair of outputs, each diode also interconnected to a respective one of the outputs; (f) a quad of filter stubs interposed in spaced pairs between a respective one of the interconnected diplexer stubs and outputs; and a ground return line attached to said input.

The present invention is also directed to a microstrip layout of the microwave frequency discriminator circuit which comprises: (a) a microstrip input conductor having an end; (b) a pair of resistors each having first and second opposite ends and being connected at the first end to the end of the input conductor; (c) a pair of microstrip transmission line diplexer stubs of unequal lengths, each diplexer stub having first and second opposite ends and being connected at the first end to the second end of a respective one of the resistors, each diplexer stub being open-circuited at the second end thereof; (d) a pair of detector diodes each having first and second opposite ends and being connected at the first end to the first end of a respective one of the diplexer stubs; (e) a pair of microstrip output conductors, each diode at the second end thereof being connected to a respective one of the output conductors; (f) a quad of microstrip filter stubs each interposed in spaced pairs in a respective one of the output conductors; and a wrap-around ground at the edge of the microstrip substrate connected to said input.

The circuit also includes a pair of stubs of highly-RF-absorptive lossy material superimposed over a portion of the filter stubs. Each filter stub has an open-circuited end.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which:

FIG. 1 is a schematic diagram of an unequal stub length diplexing microwave frequency discriminator circuit of the present invention.

FIG. 2 is a microstrip layout of the discriminating circuit of FIG. 1.

DETAILED DESCRIPTION OF THE INVENTION

Referring now to the drawings, and particularly to FIG. 1, there is shown a schematic diagram of a microwave frequency discriminator circuit of the present invention, generally designated 10. The discriminator circuit 10 is primarily useful as a frequency linearization device for a voltage-controlled oscillator (not shown), although other applications for the circuit 10 are within the purview of one of ordinary skill in the art.

As seen in FIG. 1, the discriminator circuit 10 basically includes an input conductor 12, a ground 13, a pair of output conductors 14 and 16 and a pair of resistors 18 and 20, a pair of transmission line diplexer stubs 22 and 24, a pair of detector diodes 26 and 28, and a quad of filter stubs 30, 31, 32 and 33. The resistors 18, 20 are each connected at one end 18A, 20A at a common junction 34 to the same end 12A of the input conductor 12 and in parallel relation to one another. The ground 13 is connected to the conductor 12 away from the end 12A. The transmission line diplexer stubs 22 and 24 are of unequal lengths. Each stub 22, 24 at one end 22A, 24A is connected serially to an opposite end 18B, 20B of a respective one of resistors 18, 20 and in parallel relation to one another. Further, each stub 22, 24 has an open-circuited end 22B, 24B.

The detector diodes 26, 28 of the circuit 10 are each connected at one end 26A, 28A at a common junction 36, 38 with a respective end 22A, 24A of one stub 22, 24 and an opposite end 18B, 20B of one respective resistor 18, 20. Also, each diode 26, 28 at an opposite end 26B, 28B is interconnected to a respective portion 14A, 16A of one respective output conductor 14, 16.

The filter stubs 30, 31 and 32, 33 are interposed in spaced pairs in respective output conductors 14 and 16 connected respectively with portions 14A, 14B and 16A, 16B thereof. The circuit 10 also has a pair of blocks 40 and 42 of highly-RF-absorptive lossy material superimposed over the output portion of the respective filter stubs 30, 32. The filter stubs 30, 31, 32, 33 perform a low-pass filter function that can pass the diode rectified low frequency and DC signals to the outputs, while keeping the microwave signals from exiting. The filter stubs 30, 31, 32, 33 all are open-circuited microstrip stubs of approximately 35 ohms characteristic impedance, and each is of effective electrical length one-quarter of a wavelength at the center frequency of operation.

Filter stubs 30, 31 are interconnected by conductor portion 14A which is a much narrower microstrip line of approximately 144 ohms characteristic impedance, and of electrical length of one-quarter wavelength at the center frequency of operation. It is the set of two low impedance open stubs 30, 31, separated by the length of high impedance conductor line 14A, that forms a three-section microwave filter, providing deep suppression of the microwave carrier applied to the discriminator circuit 10. The input stub 31 of this microwave filter plays a dual role: its second function is to provide diode 26 with an RF return to ground. At the design center frequency the open circuit at one end of stub 31 transforms to an RF short-circuit to ground at its diode connected end, so that the RF applied to the other end of the diode 26 will fully excite the diode. The low frequency/DC signal generated in the diode, however, can and does also flow out the input side of the series-connected diode. It is desirable to return the input end of the diode to ground potential as soon as is possible at low frequencies, so that the majority of the signal generated will appear usefully on the output side, out through 14. Part of this signal will be lost in the diplexing resistor 18, but little more is lost because the ground return line 13 connected to input line 12 routes this low frequency signal directly to ground via a wrap-around ground at the edge of the microstrip substrate. The approximately 144 Ohm microstrip line 13 is approximately one quarter wavelength long at the carrier frequency, so that ground is transformed to an approximate open circuit at the carrier frequency at the point of attachment to line 12, with minimal disturbance to the applied microwave signal. The filter stubs 32, 33 and the quarter-wave filter portion 16A of conductor 16 located between the filter stubs 32 and 33 similarly define a three-section microwave filter as just described. The outputs from the filters at the outputs of the stubs 30, 32 lead to the external environment at rectangular lands via conductor portions 14A, 16A which are a continued length of the 144 ohms line. The rectangular lands located on the outer edge of the substrate would be attached to connector pins which lead to low-frequency processing electronics.

Referring to the FIG. 2, there is illustrated a microstrip layout of the discriminator circuit 10. The circuit 10 includes a substrate 44, the microstrip input conductor 12, the ground return line 13 at the edge of the substrate, and pair of microstrip output conductors 14, 16, the pair of resistors 18, 20, the pair of microstrip transmission line diplexer stubs 22, 24 of unequal lengths, the pair of detector diodes 26, 28, and the quad of microstrip filter stubs 30, 31, 32, 33. These components have the same arrangement as described earlier with reference to FIG. 1.

By way of example, the input and output conductors 12, 13, 14, 16 can be formed of nominally $\epsilon_r = 2.55$, 0.031 inch thick, one ounce copper. The resistors 18, 20 can be 0.05 inch diameter by 0.05 inch chip resistor packages, fifty-one ohms, carrying the commercial designation Mini-Systems MSRYPG-510I-S. One diplexer stub 22 can be a $1.05\lambda_o$ open 50 ohms stub, whereas the other diplexer stub 24 can be a $0.34\lambda_o$ open 50 ohms stub. As mentioned previously, each diplexer stub is open-circuited. The diodes 26, 28 can be commercially available packaged diodes carrying the commercial designation Alpha Zero-Biased Schottky diodes, DDC-4563B, having a capacity of 0.3 pf. The blocks 40, 42 of highly-RF-absorptive lossy material can have a 0.030 to 0.100 inch height, carry the commercial designation Emerson & Cuming MF-124, and be held with RTV108 silicone adhesive directly on the top surface of the substrate, over the conductor pattern. The substrate 44 used to support the various components can preferably be a material commercially available from Rogers Corporation known as RT/duroid 6002 of dielectric constant 2.94. The unequal lengths of the diplexer stubs 22, 24 approximately equalize the linearity of the slopes of the two detector diodes 26, 28. Another material, although less suitable, is TEFLON fiberglass mat material with electro-deposited copper foil on each side.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

Having thus described the invention, what is claimed is:

1. A microwave frequency discriminator circuit, comprising:
   an input;
   a pair of resistors connected in common to said input;
   a pair of transmission line diplexer stubs of unequal lengths, each diplexer stub connected to a respective one of said resistors and having an open-circuited end;
   a pair of detector diodes each connected in common along with one of said diplexer stubs to a respective one of said resistors;
   a pair of outputs, each diode being connected to a respective one of said outputs; and a quad of filter stubs interposed in spaced pairs between a respective one of said interconnected diodes and outputs; and a ground return line attached to said input.

2. The discriminator circuit of claim 1 further comprising:
a pair of blocks of highly-RF-absorptive lossy material superimposed over a portion of said filters.

3. The discriminator circuit of claim 1 wherein said input and output, are microstrip lines.

4. The discriminator circuit of claim 1 further comprising a substrate supporting said input, outputs, resistors, diplexer stubs, diodes and filter stubs.

5. The discriminator circuit of claim 4 wherein each said filter stub has an open-circuited end.

6. The discriminator circuit of claim 1 wherein said unequal length diplexer stubs are microstrip lines.

7. The discriminator circuit of claim 1 wherein said filter stubs are microstrip lines.

8. A microwave frequency discriminator circuit, comprising:
a microstrip input conductor having an end;
a pair of resistors each having first and second opposite ends and being connected at said first end to said end of said input conductor;
a pair of microstrip transmission line diplexer stubs of unequal lengths, each diplexer stub having first and second opposite ends and being connected at said first end to said second end of a respective one of said resistors, said each diplexer stub being open-circuited at said second end thereof;
a pair of detector diodes each having first and second opposite ends and being connected at said first end to said first end of a respective one of said diplexer stubs;
a pair of microstrip output conductors, each diode at said second end thereof being connected to a respective one of said output conductors;
a quad of microstrip filter stubs interposed in spaced pairs in a respective one of said output conductors; and a ground return line attached to said input conductor.

9. The discriminator circuit of claim 8 further comprising:
a pair of blocks of highly-RF-absorptive lossy material superimposed over a portion of said filters.

10. The discriminator circuit of claim 8 further comprising a substrate supporting said input and output conductors, resistors, diplexer stubs, diodes and filter stubs.

11. The discriminator circuit of claim 10 wherein each said filter stub has an open-circuited end.

* * * * *